Jan. 13, 1970 L. V. GALETTO ET AL 3,490,027

TRANSISTOR CONVERTER AMPLIFIER CIRCUIT

Filed Dec. 5, 1967 2 Sheets-Sheet 1

INVENTORS
LOUIS V. GALETTO
JAMES J. ROONEY

BY G. R. Gugger

AGENT

United States Patent Office 3,490,027
Patented Jan. 13, 1970

3,490,027

TRANSISTOR CONVERTER AMPLIFIER CIRCUIT

Louis V. Galetto, Vestal, and James J. Rooney, Apalachin, N.Y., assignors to International Business Machines Corporation, Armonk, N.Y., a corporation of New York Filed Dec. 5, 1967, Ser. No. 688,095
Int. Cl. H02m 3/22, 5/40
U.S. Cl. 321—2 2 Claims

ABSTRACT OF THE DISCLOSURE

A converter amplifier circuit incorporating two alternately driven power transistors wherein an "AND" gate circuit is connected to the base of each transistor to prevent the transistors from conducting simultaneously.

BACKGROUND OF THE INVENTION

In the voltage converter art, transistors have been used as switches to switch an A.C. energy source to an output transformer and filter capacitor to provide a regulated amplifier D.C. output. In a typical circuit of this type, a low power oscillator drives the bases of two power transistors alternately. This alternate drive saturates the respective transistor and by transformer action produces a square wave on the secondary of the output transformer. The magnitude of this square wave is a function of the voltage and the turns ratio of the output transformer. The frequency of the secondary voltage is the frequency of the oscillator drive.

In converter circuits of this type, it is desirable to have the drive frequency as high as possible. As the drive frequency is increased, the required physical size and the component value of the transformer and filter capacitor decreases. The upper limit of the frequency of operation is limited by the ability of the power device to follow at high frequencies and this inability of the transistor to follow is primarily due to the geometry of the device and the storage delay time. Overdrive base current in the power transistors must be provided to insure operation for varying loads and worse case beta of the devices. This overdrive base current must be removed before the transistor can conduct in its linear region and eventually turn off. The time required to remove this overdrive base current produces a storage delay time during the turn-off transition and since this storage time occurs only during the turn-off time, it is possible to have both devices conducting at the same time during transitions. If both transistors conduct simultaneously, high circulating currents result which produce inefficient operation. And as the frequency of operation is increased, the duty cycle of the high circulating current increases and excessive heating of the power devices occurs.

The most common way to eliminate the high circulating currents in the converter circuit described is to delay the "on" pulse drive. The time delay is set to be greater than the maximum storage time of the transistors being used. However, since most transistors would not have the worst case storage time, maximum half-cycle "on" time would not be obtained. The present proposed method is able to make use of maximum half-cycle "on" time because when the off-going transistor turns "off," the on-going transistor turns "on" without the need to remain "off" for a fixed time.

Accordingly, it is a primary object of the present invention to provide a novel transistor power supply circuit wherein high circulating currents due to storage delay are eliminated.

Another object of the present invention is to provide a novel converter amplifier transistor circuit wherein the off-going transistor turns "off," the on-going transistor turns "on" without the need to remain "off" for a fixed time.

A further object of the present invention is to provide a novel converter amplifier transistor circuit wherein the transistor which is "off" is not allowed to conduct until the collector of the "on" transistor has come out of saturation.

A still further object of the present invention is to provide a novel converter amplifier transistor circuit wherein "AND" gate circuitry is provided in the bases of the transistors to prevent the transistor which is "off" from conducting until the collector of the "on" transistor has come out of saturation.

SUMMARY OF THE INVENTION

The foregoing are attained with the present invention by utilizing a pair of positive "AND" gate circuits connected to the bases of a pair of alternately pulsed NPN transistors of the converter amplifier. One input diode of each "AND" gate is connected to the input transformer of the converter amplifier and the other input diodes are cross-connected to the collector electrodes of the NPN transistors. As a result of these "AND" gate connections, a positive pulse from the input transformer will not be able to drive the transistor which is "off" into conduction until the collector of the "on" transistor has come out of saturation and the collector voltage has swung positive to operate the "AND" gate. Thus, simultaneous conduction of both transistors is prevented and high circulating currents are eliminated which results in much more efficient operation of the converter amplifier circuit.

The foregoing and other objects, features and advantages of the invention will be apparent from the following more particular description of a preferred embodiment of the invention as illustrated in the accompanying drawings.

DESCRIPTION OF THE PREFERRED EMBODIMENT

Figure 1:
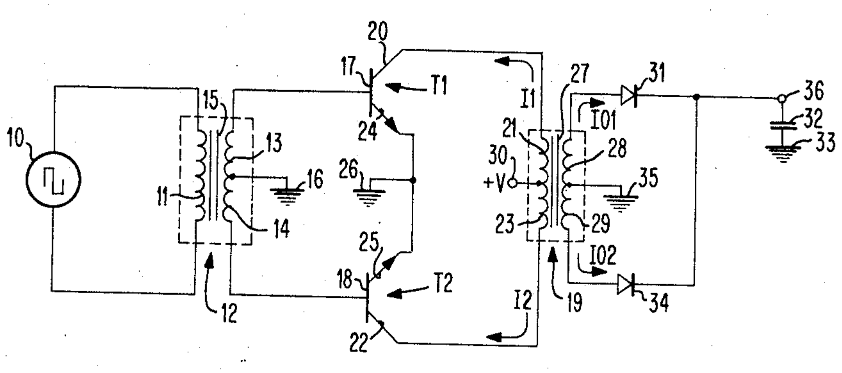
FIG. 1 is a schematic circuit diagram of a tpyical converter amplifier transistor circuit.

Referring to FIG. 1, there is illustrated a typical transistor circuit for converting an A.C. energy source to provide a regulated amplified D.C. output. An A.C. energy source in the form of a low power oscillator 10 is connected to the input winding 11 of a transformer 12. Input winding 11 and output windings 13 and 14 are wound on a magnetic core 15. One end of winding 13 and one end of winding 14 are connected to a source of ground potential 16 while the other end of winding 13 is connected to the base electrode 17 of an NPN transistor T1 and the other end of winding 14 is connected to the base electrode 18 of an NPN transistor T2.

Transistors T1 and T2 are alternately driven into saturation by oscillator 10 and transformer 12 and the transistor outputs are fed to an output transformer 19. The collector electrode 20 of transistor T1 is connected to one end of input winding 21 of output transformer 19 and the collector electrode 22 of transistor T2 is connected to one end of input winding 23. The emitter electrodes 24 and 25 are connected to a source of ground potential 26.

The input windings 21 and 23 are wound on magnetic core 27 along with output windings 28 and 29. The other ends of input windings 21 and 23 are connected to a positive voltage terminal 30. One end of output winding 28 is connected through a diode 31 to a filter capacitor 32 and a source of ground potential 33 and one end of output winding 29 is connected through a diode 34 to the filter capacitor 32 and the source of ground potential 33. The other ends of the output windings 28 and 29 are connected to a source of ground potential 35.

In operation, assuming that the input pulse from oscillator 10 is positive, positive voltage from output winding 13 of transformer 12 will be applied to the base 17 of NPN transistor T1 driving it into conduction and at the same time negative voltage from the output winding 14 will be applied to the base 18 of NPN transistor T2 to maintain it in an "off" condition. With transistor T1 in conduction, current I will flow from the positive voltage source 30, through the input winding 21 of output transformer 19, and transistor T1 to the ground connection 26. Output windings 28 and 29 are wound 180° out of phase with input windings 21 and 23 which results in a positive voltage from winding 28 being applied to diode 31 to forward bias it and a negative voltage from winding 29 being applied to diode 34 to reverse bias it. Current I01 now flows from ground connection 35, through output winding 28, diode 31, and filter capacitor 32 to the ground connection 33 and a positive voltage D.C. output appears at output terminal 36.

When the input from oscillator 10 swings negative, negative voltage from output winding 13 of transformer 12 is applied to the base 17 of NPN transistor T1 to turn it "off" and positive voltage from output winding 14 is applied to the base electrode 18 of NPN transistor T2 to drive it into conduction. Current I2 will now flow from the positive voltage source 30, through the input winding 23 of output transformer 19, and transistor T2 to the ground connection 26. The voltage from output winding 28 now swings negative to reverse bias and block diode 31 while the voltage from output winding 29 swings positive to forward bias diode 34. Current I02 now flows from ground connection 35, through output winding 29, diode 34, and filter capacitor 32 to the ground connection 33 to maintain the positive voltage D.C. to output at terminal 36.

Figure 2A:
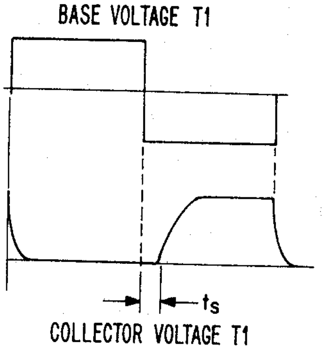
FIG. 2*a* and 2*b* are diagrams illustrating the base and collector votlage wave forms for the transistors in the circuit shown in FIG. 1.
Figure 2B:
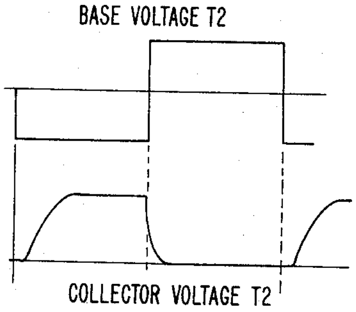

As was previously mentioned, in the above-described circuit of FIG. 1 overdrive base current in the power transistors T1 and T2 must be provided to insure operation for varying loads and this overdrive base current must be removed before the transistor can conduct in its linear region and eventually turn off. The time required to remove this overdrive base current produces a storage delay time during the turn-off transition and since this storage time occurs only during the turn-off time, it is possible to have both transistors conducting at the same time during transitions. Referring to the diagrams in FIGS. 2*a* and 2*b*, there is shown a storage delay time $t_s$ during the turn-off of transistor T1 during which time transistor T2 is going into conduction. It is possible that both transistors T1 and T2 will conduct simultaneously and, if this condition occurs, the power supply voltage at terminal 30, FIG. 1, will have trouble delivering sufficient current causing it to fail and resulting in a break in the D.C. output voltage at terminal 36. Also, excessive current flow results in heating in transistors T1 and T2 causing them to break down.

Figure 3:
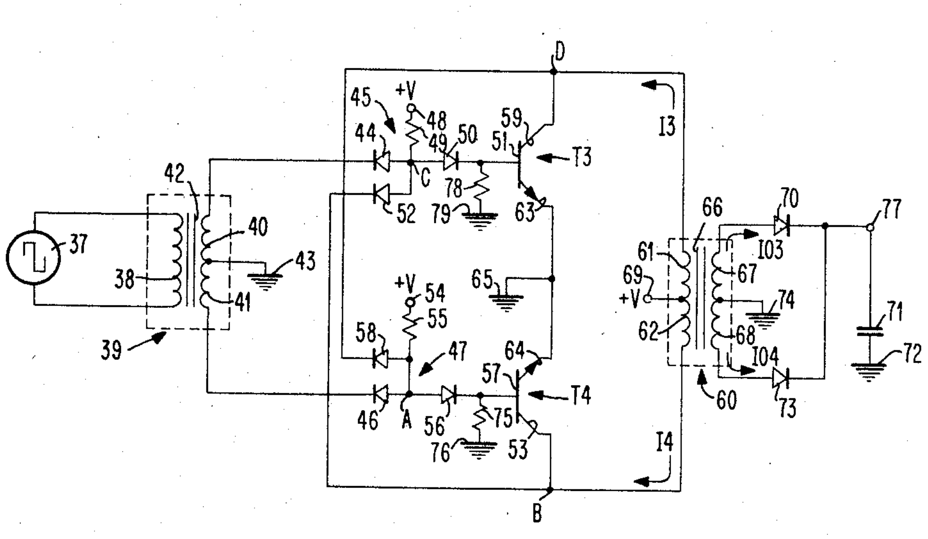
FIG. 3 is a schematic diagram of the circuit of FIG. 1 with the principles of the present invention embodied therein.

The above problems are eliminated by the preferred embodiment of the present invention shown in FIG. 3. The circuit shown in FIG. 3 is essentially the same as the circuit shown in FIG. 1 with the addition of positive "AND" gate circuits for controlling the turn-on and turn-off of NPN transistors T3 and T4. An A.C. energy source in the form of a low power oscillator 37 is connected to the input winding 38 of a transformer 39. Input winding 38 and output windings 40 and 41 are wound on magnetic core 42. One end of winding 40 and one end of winding 41 are connected to a source of ground potential 43 while the other end of winding 40 is connected to an input diode 44 of a positive "AND" gate 45 and the other end of winding 41 is connected to an input diode 46 of a positive "AND" gate 47. Gate 45 is connected to a positive voltage terminal 48 through a resistor 49 and has its output diode 50 connected to the base electrode 51 of transistor T3. The other input diode 52 of gate 45 is connected to the collector electrode 53 of transistor T4. Gate 47 is connected to a positive voltage terminal 54 through a resistor 55 and has its output diode 56 connected to the base electrode 57 of transistor T4. The other input diode 58 of gate 47 is connected back to the collector electrode 59 of transistor T3.

Transistors T3 and T4 are alternately driven into saturation through the gates 45 and 47 by oscillator 37 and transformer 39 and the transistor outputs are fed to an output transformer 60. The collector electrode 59 of transistor T3 is connected to one end of input winding 61 of output transformer 60 and the collector electrode 53 of transistor T4 is connected to one end of input winding 62. The emitter electrodes 63 and 64 of transistors T3 and T4 are connected to a source of ground potential 65.

The input windings 61 and 62 are wound on magnetic core 66 along with output windings 67 and 68. The other ends of input windings 61 and 62 are connected to a positive voltage terminal 69. One end of output winding 67 is connected through a diode 70 to the filter capacitor 71 and the source of ground potential 72 and one end of output winding 68 is connected through a diode 73 to the filter capacitor 71 and the source of ground potential 72. The other ends of the output windings 67 and 68 are connected to a source of ground potential 74.

In operation, assuming that the input pulse from oscillator 37 is positive, positive voltage from output winding 40 will be applied to diode 44 reverse biasing it and negative voltage from output winding 41 will be applied to diode 46 to forward bias it. Current will flow from the positive voltage terminal 54, through resistor 55, diode 46, and winding 41 to the ground connection 43. As a result of this current flow, the potential at point A goes negative to reverse bias diode 56 and the emitter-base junction of transistor T4. Transistor T4 is thus turned off and maintained in a blocking condition. The base-emitter charge on transistor T4 is bled off through a resistor 75 and ground connection 76. When the collector 53 of transistor T4 comes out of saturation, the potential at point B goes positive and reverse biases diode 52. With both diodes 44 and 52 reverse biased and in a blocking condition, the potential at point C goes positive to forward bias diode 50 and current now flows from the positive voltage terminal 48, through resistor 49, diode 50, and the base-emitter junction of transistor T3 to the ground connection 65 to place transistor T3 in conduction.

With transistor T3 in conduction, current I3 will flow from the positive voltage source 69, through the input winding 61 of output transformer 60, and transistor T3 to the ground connection 65. Output windings 67 and 68 are wound 180° out of phase with input windings 61 and 62 which results in a positive voltage from winding 67 being applied to diode 70 to forward bias it and a negative voltage from winding 68 being applied to diode 73 to reverse bias it. Current I03 now flows from ground connection 74, through output winding 67, diode 70, and filter capacitor 71 to the ground connection 72 and a positive voltage D.C. output appears at output terminal 77.

When the output from oscillator 37 swings negative, negative voltage from output winding 40 of transformer 39 is applied to the nonconducting diode 44 to forward bias it and current now flows from the positive voltage terminal 48, through resistor 49, diode 44, and winding 40 to the ground connection 43. The potential at point C will now swing negative to reverse bias the diode 50 and the emitter-base junction of transistor T3 thus turning transistor T3 off and placing it in a blocking condition with the emitter-base charge on transistor T3 being bled off through a resistor 78 and ground connection 79. Positive voltage is also applied from the output winding 41 to the conducting diode 46 to reverse bias this diode and render it nonconductive thereby attempting to switch transistor T4 into conduction. However, as previously mentioned, the transistors have a storage delay time $t_s$ during the turn-off transition and as a result transistor T3 does not immediately stop conducting and the collector voltage at point D remains down. As long as the potential at point D remains down, diode 58 will remain forward biased and will conduct current from the positive voltage terminal 54. The potential at point A then will also remain down to reverse bias diode 56 and the emitter-base junction of transistor T4 and transistor T4 is prevented from going into conduction as long as transistor T3 is conducting.

When transistor T3 stops conducting, the potential at point D rises to reverse bias diode 58 and since both diodes 46 and 58 are now in blocking condition the potential at point A rises to forward bias diode 56 and the emitter-base junction of transistor T4 and current flows form the positive voltage terminal 54 and diode 56 to drive transistor T4 into conduction. Current I4 now flows from the positive voltage terminal 69, input winding 62 of transformer 60, and transistor T4 to the ground connection 65. The voltage from output winding 67 swings negative to reverse bias diode 70 and the voltage from output winding 68 swings positive to forward bias diode 73. Current I04 now flows from ground connection 74, through output winding 68, diode 73, and filter capacitor 71 to the ground connection 72 to maintain the positive voltage D.C. output at terminal 77.

Figure 4A:
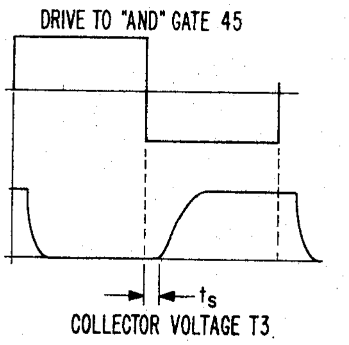
FIG. 4*a* and 4*b* are diagrams illustrating the base and collector voltage wave forms for the transistors in the circuit shown in FIG. 3.
Figure 4B:
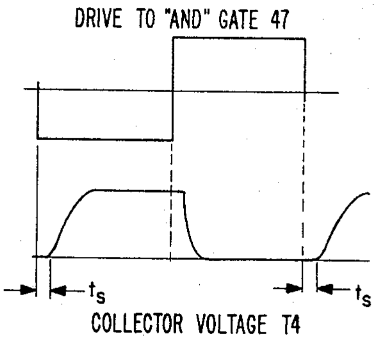

It will be understood that when the oscillator input switches transistor T4 "off" and transistor T3 "on," diode 52 in gate 45 will function in the same manner as diode 58 in gate 47 did to insure that transistor T3 does not start to conduct until transistor T4 has stopped conducting. The wave forms shown in FIGS. 4*a* and 4*b* illustrate the effect the "AND" gates have on the collector voltages of transistors T3 and T4.

While the invention has been particularly shown and described with reference to a preferred embodiment thereof, it will be understood by those skilled in the art that various changes in form and details may be made therein without departing from the spirit and scope of the invention.

What is claimed is:

1. A converter circuit comprising:

an alternating current voltage source, a first transformer having an input winding connected across said voltage source and first and second output windings each of which has one end connected to a source of ground potential, first and second transistors each having base, collector and emitter electrodes, said emitters being connected to a source of ground potential, a first "AND" gate circuit having one input diode connected to the other end of said first output winding and another input diode connected to the collector electrode of said second transistor, a second "AND" gate circuit having one input diode connected to the other end of said second output winding and another input diode connected to the collector electrode of said first transistor, a first diode coupling the output of said first "AND" gate circuit to the base electrode of said first transistor and a second diode coupling the output of said second "AND" gate circuit to the base electrode of said second transistor, said "AND" gate circuits serving to prevent said transistors from conducting simultaneously, a second transformer having first and second input windings each of which has one end connected to a direct current voltage source, with the other end of the first input winding being connected to the collector electrode of said first transistor and the other end of the second input winding being connected to the collector electrode of said second transistor, first and second output windings on said second transformer each of which has one end connected to a source of ground potential, with the other end of the first output winding being connected to a first rectifier and the other end of the second output winding being connected to a second rectifier, and a capacitor having one terminal connected to a source of ground potential and the other terminal connected to both said rectifiers.

2. A converter circuit as set forth in claim 1 wherein said first and second transistors are of the NPN type and said first and second "AND" gate circuits are each connected to a positive direct current bias voltage source.

References Cited

UNITED STATES PATENTS

| | | | |
|---|---|---|---|
| 2,987,665 | 6/1961 | Thompson | 321—2 X |
| 3,383,624 | 5/1968 | Fiala | 321—2 X |

OTHER REFERENCES

Electronic Design, "50-W Ultrasonic Amplifier," vol. 12, No. 5, Mar. 2, 1964, p. 58, Class 330—15.

LEE T. HIX, Primary Examiner

W. H. BEHA Jr., Assistant Examiner

U.S. Cl. X.R.

321—11; 330—15